United States Patent [19]

Ma et al.

[11] Patent Number: 5,779,926

[45] Date of Patent: Jul. 14, 1998

[54] PLASMA PROCESS FOR ETCHING MULTICOMPONENT ALLOYS

[75] Inventors: Diana Xiaobing Ma, Saratoga, Calif.; Daisuke Tajima, Chiba-ken, Japan; Allen Zhao, Mountain View, Calif.; Peter K. Loewenhardt, Santa Clara, Calif.; Timothy R. Webb, San Francisco, Calif.

[73] Assignee: Applied Materials, Inc., Santa Clara, Calif.

[21] Appl. No.: 596,960

[22] Filed: Feb. 5, 1996

Related U.S. Application Data

[63] Continuation-in-part of Ser. No. 597,445, Feb. 2, 1996, which is a continuation-in-part of Ser. No. 389,889, Feb. 15, 1995, which is a continuation-in-part of Ser. No. 307,870, Sep. 16, 1994.

[51] Int. Cl.$^6$ .............. B44C 1/22; C23F 1/00; H01L 21/00
[52] U.S. Cl. .............. 216/67; 216/77; 438/710; 438/742
[58] Field of Search .............. 156/643.1, 656.1, 156/646.1, 657.1, 659.11; 216/67, 77; 437/197–199, 245; 438/710, 742

[56] References Cited

U.S. PATENT DOCUMENTS

| | | |
|---|---|---|
| 4,579,618 | 4/1986 | Celestino et al. |
| 5,350,488 | 9/1994 | Webb .............. 216/77 X |
| 5,387,556 | 2/1995 | Xiaobing et al. .............. 216/77 X |

OTHER PUBLICATIONS

Schaible et. al., Reactive Ion Etching of Aluminum and Aluminum Alloys, IBM Tech. Disclosure Bulletin, vol. 21, No. 4, Sep. 1978, p. 1468, 216/77.

*Primary Examiner*—William Powell
*Attorney, Agent, or Firm*—Ashok K. Janah; James C. Wilson; Peter J. Sgarbossa

[57] ABSTRACT

A method of etching a multicomponent alloy on a substrate, without forming etchant residue on the substrate, is described. In the method, the substrate is placed in a process chamber comprising a plasma generator and plasma electrodes. A process gas comprising a volumetric flow ratio $V_r$ of (i) a chlorine-containing gas capable of ionizing to form dissociated $Cl^+$ plasma ions and non-dissociated $Cl_2^+$ plasma ions, and (ii) an inert gas capable of enhancing dissociation of the chlorine-containing gas, in introduced into the process chamber. The process gas is ionized to form plasma ions that energetically impinge on the substrate by (i) applying RF current at a first power level to the plasma generator, and (ii) applying RF current at a second power level to the plasma electrodes. The combination of (i) the volumetric flow ratio $V_r$ of the process gas and (ii) the power ratio $P_r$ of the first power level to the second power level, is selected so that the chlorine-containing etchant gas ionizes to form dissociated $Cl^+$ plasma ions and non-dissociated $Cl_2^+$ plasma ions in a number ratio of at least about 0.6:1. The increased amount of dissociated $Cl^+$ ions relative to non-dissociated $Cl_2^+$ ions etches the multicomponent alloy on the substrate at an etch rate of at least about 500 nm/min, without forming etchant residue on the substrate.

35 Claims, 5 Drawing Sheets

PLASMA PROCESS FOR ETCHING MULTICOMPONENT ALLOYS

CROSS-REFERENCE

This application is a continuation-in-part of U.S. patent application Ser. No. 08/597,445, entitled "RF Plasma Reactor with Hybrid Conductor and Multi-Radius Dome Ceiling" filed on Feb. 2, 1996, which is a continuation-in-part of U.S. patent application Ser. No. 08/389,889, filed on Feb. 15, 1995—both of which are incorporated herein by reference. Ser. No. 389,889 is a continuation-in-part of U.S. patent application Ser. No. 08/307,870, filed on Sep. 16, 1994, which is incorporated herein by reference.

BACKGROUND

This invention relates to a process for etching multicomponent alloy on a substrate.

In integrated circuit fabrication, electrically conductive features 10 are used to interconnect electronic components formed on a semiconductor substrate 11, as shown in FIG. 1a. The conductive features 10 typically include barrier layers, electrically conductive layers comprising multicomponent alloys, and antireflective layers. The conductive features 10 are formed by (i) sequentially depositing different layers 12 on the substrate 11, (ii) forming a patterned resist 13 on the deposited layers, and (iii) etching the exposed portions of the deposited layers to form the features. Typically, the deposited layers 12 are etched using a plasma of chlorine etchant gas, such as $Cl_2$ or $CCl_4$, as generally described in S. Wolf and R. N. Tauber, *Silicon Processing for the VLSI Era*, Vol. I, Chap. 16: Dry Etching for VLSI, Lattice Press, Sunset Beach, Calif. (1986), which is incorporated herein by reference.

One problem with conventional etching processes is their relative inability to control the etching selectivity ratio, which is the ratio of the rate of etching of the conductive layers 12 to the rate of etching of the resist 13. In order for the resist 13 to effectively protect the underlying conductive layers 12, the etch rate for the conductive layers must be greater than the resist etch rate. Furthermore, etchant gas reacts with the resist 13 to form polymer byproducts that deposit on sidewalls of the freshly etched features to form a "passivating" layer 14 which limits etching of the sidewalls and prevents "isotropic" etching. Isotropic etching occurs when the sidewalls of the features 10 are excessively or insufficiently etched resulting in inwardly or outwardly sloped sidewalls. Although vertical "anisotropic" etching is desirable, excessive passivating deposits 14 on the sidewalls are difficult to clean. Furthermore, deposition of polymer byproducts on chamber walls can result in flaking off and contamination of the substrate 11 with the polymer byproduct deposits. Thus, the etching selectivity ratio of the etching process is preferably at least about 2.5, and more preferably at least about 3.

Another problem with conventional etching processes arises from the multicomponent alloys used to form the electrically conductive layers 12. A typical alloy comprises about 97% aluminum, and 2% silicon and copper in the form of impurities. While aluminum is readily etched by chlorine-containing etchant gas, silicon and copper impurities are difficult to etch and form etchant residues 15 that remain on the substrate. These are several reasons for etchant residue formation. First, the silicon and copper impurities are etched at lower etch rates than the aluminum, resulting in formation of copper and silicon containing residues on the substrate. Second, the vapor pressure of etchant byproducts formed from the copper and silicon, such as $CuCl$, is low compared to the vapor pressure of $AlCl_3$, under normal etch process conditions. Residue formation also occurs because the copper and silicon impurities accumulate at the grain boundaries of the aluminum, and because non-reactive diffusion layers formed at the interface of aluminum layer and the barrier layer, such as $Ti_2O$, are difficult to etch.

In one prior art method for removing the etchant residues 15, the concentration of chlorine etchant is reduced to lower the aluminum etch rate, so that silicon and copper are etched or sputtered at the same rate as the aluminum is etched. However, the precise balance of etch rates is easily disturbed by small changes in the composition of the alloy, such as presence of impurities. As a result, the etching process works efficiently only for a narrow range of alloy compositions and process conditions. Reducing the concentration of chlorine etchant also results in a decrease of the etch rate for the multicomponent alloy, providing lower process throughput.

In another method for removing the etchant residue 15, the electric field used to energetically impinge the plasma ions on the substrate 11, by electrically biasing the substrate, is increased so that high energy plasma ions sputter the etchant residue 15 off the substrate 11. However, the high energy plasma ions also sputter and etch the passivating deposits 14 formed on the sidewalls of the freshly etched features 10. The passivating deposits 14 on the sidewalls of closely spaced features 10 are etched at higher rates because the plasma ions are "channeled" and bounce off the sidewalls of the closely spaced features. In contrast, the rate of etching of the passivating deposit 14 on the sidewalls of the spaced apart features 10 is not as high. This results in high profile microloading, where the cross-sectional profile of the features 10 vary as a function of the space or distance between the features 10. It is desirable for all the features 10 to have a uniform cross-section irrespective of the spacing between the features 10. The profile microloading problem is worse when the plasma is formed in a limited space close to the substrate 11 by applying an RF current at a relatively high power level to plasma electrodes or inductor coils in a chamber having a ceiling that is close to the substrate, i.e., at a distance of 6 to 9 cms from the substrate. To avoid these problems, the plasma RF bias or source power of these conventional chambers is often limited to a maximum power of about 900 Watts, which limits removal of the etchant residue 15 on the substrate 11 and provides narrow process windows.

Another conventional plasma process chamber uses a remote plasma source, such as a microwave plasma source, to generate a plasma which is then guided to the substrate 11. The remote plasma process chambers can use a higher source power to generate the plasma, thereby alleviating some of the problems associated with low power plasmas. However, when traveling through the relatively large distance from the plasma generation source to the substrate 11, a large portion of the dissociated ions in the plasma recombine to form non-dissociated plasma species. This results in narrower etch process windows which do not allow for ease of optimization of process parameters, such as etch rates and residue control.

Accordingly, there is a need for an etching process that provides elevated etch rates and reduced formation of etchant residues. It is also desirable for the etch process to provide reduced profile microloading and substantially anisotropic etching by controlling the amount of passivating deposits formed on the sidewalls of the etched features. It is further desirable for the etching process to provide a high etching selectivity ratio. It is also desirable to generate a high power plasma sufficiently proximate to the substrate to contain a relatively large amount of dissociated plasma ions, to provide superior etching properties.

SUMMARY

The present invention is directed to a method for etching a multicomponent alloy on a substrate substantially without forming etchant residue. In one version of the invention, the substrate is placed in process chamber comprising a plasma generator and plasma electrodes. Process gas comprising (i) etchant gas capable of dissociating in an electric field to form dissociated ions and non-dissociated ions, and (ii) inert gas capable of enhancing dissociation of the etchant gas, is introduced into the process chamber. Preferably, the process gas comprises a volumetric flow ratio $V_r$ of (i) a chlorine-containing gas capable of ionizing to form dissociated $Cl^+$ plasma ions and non-dissociated $Cl_2^+$ plasma ions, and (ii) an inert gas capable of enhancing dissociation of the chlorine-containing gas. The process gas is ionized to form plasma ions that energetically impinge on the substrate by (i) applying RF current at a first power level to the plasma generator, and (ii) applying RF current at a second power level to the plasma electrodes. The combination of (i) the volumetric flow ratio $V_r$ of the process gas and (ii) the power ratio $P_r$ of the first power level to the second power level, is selected so that the chlorine-containing gas ionizes to form dissociated $Cl^+$ plasma ions and non-dissociated $Cl_2^+$ plasma ions in a number ratio of at least about 0.6:1. The increased amount of dissociated $Cl^+$ ions relative to non-dissociated $Cl_2^+$ ions etches the multicomponent alloy on the substrate at an etch rate of at least about 500 nm/min, while simultaneously removing substantially all the etchant residue on the substrate.

In another aspect of the invention, a substrate is placed in a quasi-remote plasma zone of a process chamber comprising (i) a ceiling with an apex at a height H above the substrate, the height H being from about 100 mm to about 170 mm for a substrate having a diameter D of from about 150 mm to about 304 mm, and (ii) a plasma generator capable of forming a plasma below the ceiling and above the substrate. Process gas comprising a volumetric ratio $V_r$ of (i) chlorine-containing gas and (ii) inert gas is introduced into the chamber. The process gas is ionized in the quasi-remote plasma zone, so that the chlorine-containing gas ionizes substantially directly above the substrate to form dissociated $Cl^+$ ions and non-dissociated $Cl_2^+$ ions in a number ratio of at least about 0.6:1, to etch the multicomponent alloy on the substrate substantially without forming etchant residue. Because the quasi-remote plasma source generates a plasma in a relatively large volume immediately adjacent to and directly above the substrate, the plasma etching the substrate contains an increased amount of dissociated $Cl^+$ ions relative to non-dissociated $Cl_2^+$ ions. Generating the plasma in the quasi-remote plasma zone allows the plasma to etch the substrate before a large amount of the dissociated ions $Cl^+$ ions recombine to form non-dissociated $Cl_2^+$ ions.

In yet another aspect of the invention, the frequency of the RF current applied to the inductor coil around the process chamber is reduced to a low frequency of less than about 6 MHZ, and more preferably from about 1 to about 3 MHZ. At this low frequency, capacitive coupling from the inductor coil is reduced, and the plasma power level can be increased to levels greater than 750 watts, and more preferably greater than 1000 watts, to provide a high density inductively coupled plasma without increasing the kinetic bombardment energy of the plasma ions, to provide high etch rates, reduced etchant residue, and reduced profile microloading.

DRAWINGS

These and other features, aspects, and advantages of the present invention will be better understood from the following drawings, description and appended claims, which illustrate examples of the invention, where:

DESCRIPTION

Figure 1A:
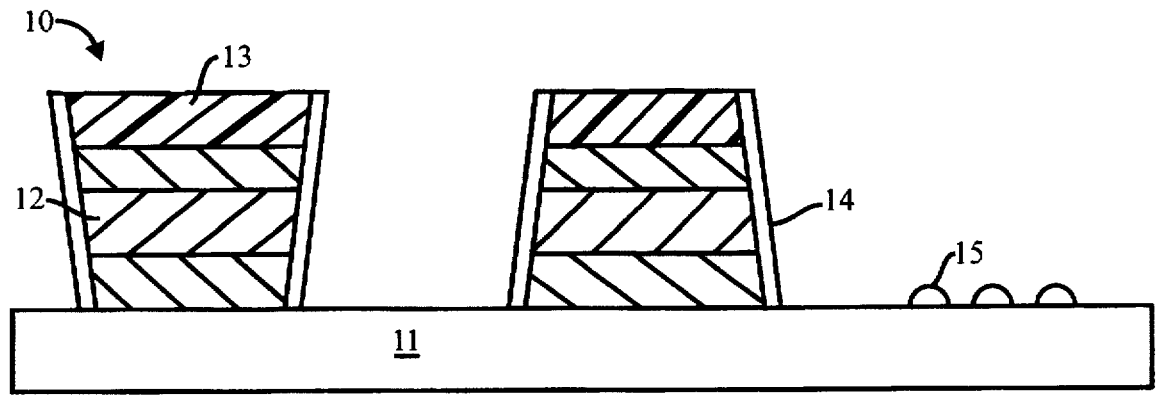
FIG. 1a (Prior Art) is a schematic in vertical cross-section of a prior art substrate showing etched features having sloped sidewalls and etchant residue formation on the substrate.
Figure 1B:
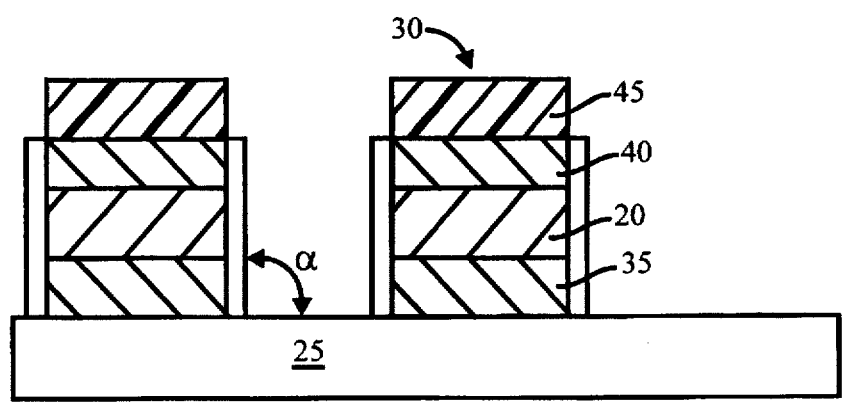
FIG. 1b is a schematic in vertical cross-section of a substrate processed according to the present invention showing substantially anisotropically etched features with substantially no etchant residue on the substrate.

The present invention is directed to an etching process for etching a multicomponent alloy layer 20 on a substrate 25, without forming etchant residue on the substrate 25. FIG. 1b shows portions of a substrate 25 processed according to the present invention. The multicomponent alloy 20 typically includes first and second components, the first components being substantially more reactive to etchant plasma, or having a higher vapor pressure, than the second components. The multicomponent alloy is difficult to etch because the more reactive first components are etched at a faster rate, or volatilize faster because of their higher vapor pressure, than the second components. This results in the second components forming etchant residue on the substrate 25 in conventional etching processes.

The etching process is typically performed on a substrate 25, such as a semiconducting silicon or gallium arsenide wafer. Electrically conductive features 30 are etched from conductive layers deposited on a substrate 25, the conductive layers typically including (i) a diffusion barrier layer 35, such as titanium, tungsten, titanium-tungsten or titanium nitride; (ii) an electrically conductive multicomponent alloy 20 comprising first components, such as aluminum, and second components, such as copper and silicon; and (iii) an antireflective layer 40, comprising silicon, titanium nitride or titanium-tungsten. Each layer is typically about 1,000 nm to about 100,000 nm thick. An etching resist 45, such as photoresist, is applied over the conductive layers and patterned using photolithographic methods to prevent etching of underlying portions of the conductive layers. The etched features 30 are typically sized from about 0.2 to about 10 microns, and the spacing between the features 30 typically is from about 0.2 microns to about 10 microns.

Figure 2:
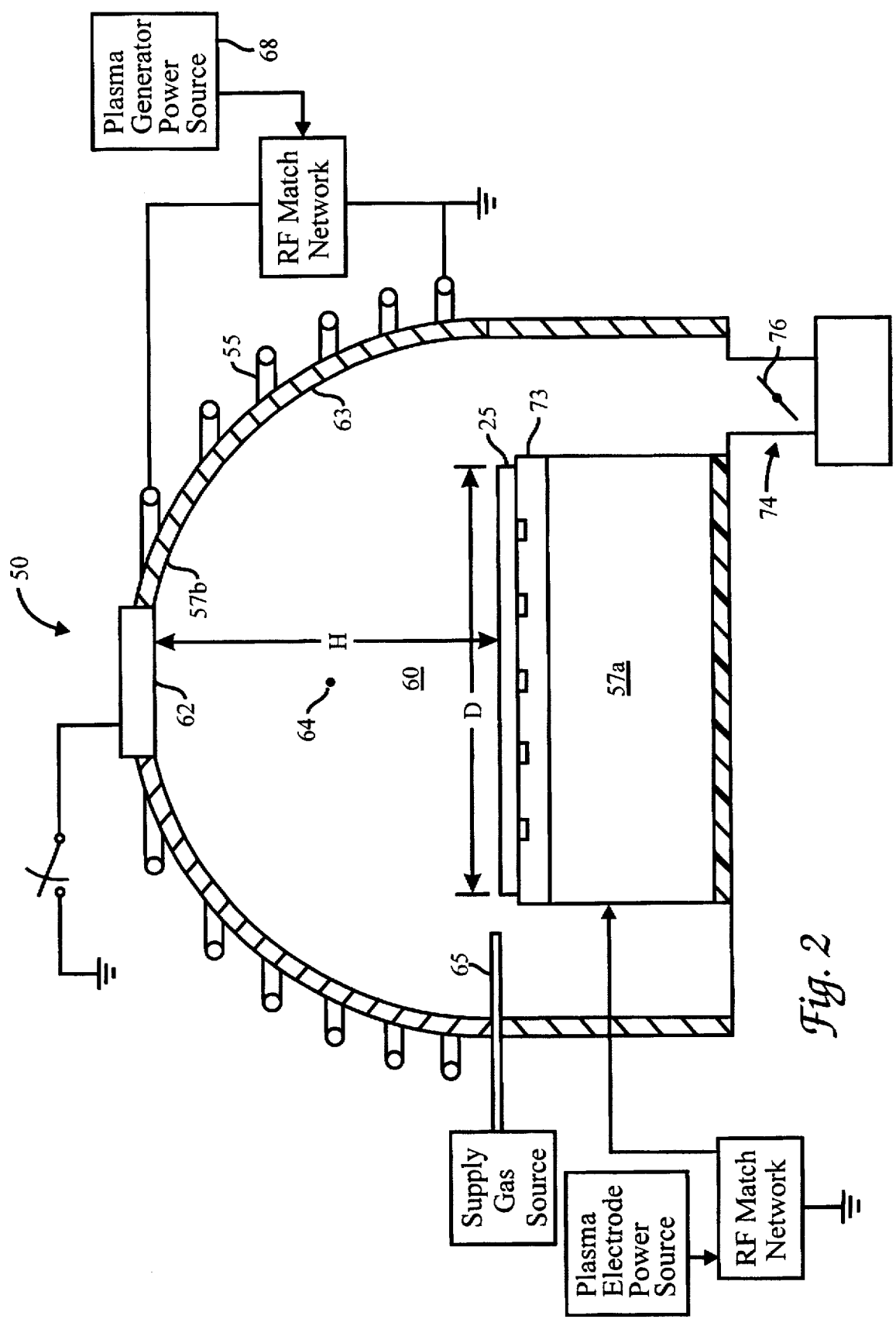
FIG. 2 is a schematic view in vertical cross-section of a process chamber suitable for practicing the process of the present invention.

A process chamber 50 suitable for practicing the etching process of the present invention is illustrated in FIG. 2, and will be commercially available from Applied Materials Inc., Santa Clara, Calif., under the trade name DPS Process Chamber. The particular embodiment of the process chamber 50, shown herein, is suitable for processing of semiconductor substrates 25, is provided only to illustrate the invention, and should not be used to limit the scope of the invention. For example, the etching process of the present invention can be used to etch any substrate 25, and can be used for manufacturing processes other than semiconductor fabrication.

In the etching process, the substrate 25 is placed in the process chamber 50. A process gas comprising a volumetric flow ratio $V_r$ of chlorine-containing etchant gas to inert gas is introduced into the process chamber 50. The chlorine-containing gas is capable of ionizing in a plasma to form dissociated $Cl^+$ ions and non-dissociated $Cl_2^+$ ions, and the inert gas is capable of enhancing dissociation of the chlorine-containing gas. Plasma ions are formed from the process gas by applying an RF current at a first power level to a plasma generator 55 adjacent to the process chamber. The plasma ions are attracted to the substrate by applying an RF current having a second power level to plasma electrodes 60 in the process chamber. The combination of (i) the volumetric flow ratio $V_r$ of the process gas, and (ii) the power ratio $P_r$ of the first power level to the second power level, is selected so that the chlorine-containing etchant gas ionizes to form $Cl^+$ ions and $Cl_2^+$ ions in a number ratio of at least about 0.6:1. It is believed that the increased amount of dissociated $Cl^+$ ions relative to non-dissociated $Cl_2^+$ ions allows fast etching of the first components of the multicomponent alloy 20 (at etch rates exceeding about 500 nm/min), without sacrificing the etch rate of the second components, and consequently without forming etchant residue on the substrate 25.

It is preferred to use a process chamber 50 having a quasi-remote plasma zone 60 to obtain optimal properties for the etching process carried out in the chamber. The quasi-remote plasma zone 60 of the process chamber 50 comprises (i) a ceiling 62 with an apex at a height H above the substrate, the height H being from about 100 mm to about 175 mm (4 to 7 inches) for a substrate having a diameter D of from about 150 mm to about 304 mm (6 to 12 inches), and (ii) a plasma generator 55 capable of forming a plasma below the ceiling 62 and directly above the substrate 25. More preferably, the quasi-remote plasma zone 60 of the process chamber is surrounded by sidewalls 63 adjacent to the substrate, and comprises a volume of at least about 10,000 cm$^3$, and more preferably from about 10,000 to about 50,000 cm$^3$. Most preferably, the quasi-remote plasma zone 60 has a center 64 located at a distance of about 50 to about 150 mm directly above the substrate 25, and more preferably at a distance that is greater than about 75 mm and less than about 125 mm from the substrate 25. Process gas is distributed in the process zone 60 using a gas distributor 65 peripherally disposed about the substrate 25.

It has been discovered that in a quasi-remote plasma zone 60 the chlorine-containing gas can be ionized to form dissociated $Cl^+$ ions and non-dissociated $Cl_2^+$ ions in a number ratio of at least about 0.6:1, more preferably of at least about 1:1, and most preferably greater than about 5:1, to etch the multicomponent alloy 20 on the substrate 25 at high etch rates, without forming etchant residue on the substrate 25. It is believed that the plasma etching the substrate contains an increased amount of dissociated $Cl^+$ ions relative to non-dissociated $Cl_2^+$ ions, because the plasma is generated in a relatively large volume of space immediately adjacent to the substrate 25, which allows the plasma to etch the substrate 25 before a large amount of the dissociated ions $Cl^+$ ions recombine to form non-dissociated $Cl_2^+$ ions. If the center 64 of the plasma zone 60 is remote from the substrate 25, for example at a distance of greater than about 30 cms, the dissociated plasma ions recombine to form non-dissociated ions while traveling from the remote plasma source to the substrate. Conversely, if the center 64 of the plasma zone 60 is too close to the substrate 25, i.e., less than about 10 cms, the high power current applied to the plasma source to increase dissociation of the plasma ions, cause the plasma ions to have excessively high kinetic energies, which results in poor etching performance. Similarly, if the volume of the plasma zone 60 is excessively large, the dissociated ions in the plasma zone recombine to form non-dissociated species. Also, if the volume of the plasma zone 60 is too small, it is difficult to form dissociated plasma ions because the mean free path of the energized inert gas ions is excessively small, resulting in fewer collisions between the inert gas ions and the etchant gas molecules. For these reasons, it is preferred to use the quasi-remote plasma zone 60.

The ceiling 62 of the process chamber 50 can be flat or rectangular shaped, arcuate, conical, dome-shaped, or multi-radius dome-shaped. Preferably, the process chamber 50 has a multi-radius dome-shaped ceiling 62 above the substrate to provide a uniform distribution of plasma source power across the entire volume of the plasma zone 60 to increase dissociation of the etchant gas. The dome-shaped ceiling 62 provides the advantage that dissociated ion recombination losses near the substrate 25 are less than those experienced with a flat ceiling, so that plasma ion density is more uniform across the substrate 25. This is because ion recombination losses are affected by the proximity of the ceiling 62, and the dome-shaped ceiling is further from the substrate center than a flat ceiling.

Preferably, the plasma generator 55 comprises an inductor coil wrapped around the sidewall 66 of the process chamber 50. The inductor coil plasma generator 55 is connected to an RF power supply 68. When an RF current having a first power level is applied through the coil, the coil inductively couples energy into the chamber 50 to generate a plasma from the process gas in the process zone 60. Preferably, the plasma generator 55 comprises a multi-radius dome-shaped inductor coil having a "flattened" dome shape as shown in FIG. 2, that provides the advantage of more efficient use of plasma source power and greater plasma ion density over the substrate center. This is because ion density is affected by local ionization near the inductor coil, and a multi-radius inductor coil is closer to the substrate center than a hemispherical coil. In another preferred embodiment, the ceiling 62 comprising a multi-radius dome having at least a center radius R and a corner radius r less than the center radius R, wherein R/r is in a range between on the order of about 2 and about 10.

In this inductively coupled RF process chamber 50, etch selectivity is enhanced, ion damage is reduced, etch profile is enhanced, and ion density uniformity is improved while optimizing plasma ion density or source power efficiency. This result is achieved by adhering to a particular conformal coil-dome geometry including a particular ceiling dome apex height range relative to the substrate. Etch selectivity is provided by depositing passivation species from the plasma onto the substrate 25. For example, in etching a silicon dioxide layer over a polysilicon layer, passivation species including polymers adhere more strongly to polysilicon than to silicon dioxide, so that the polysilicon etches more slowly than the silicon dioxide to provide the desired etch selectivity. In silicon dioxide etch processes, the polymers are formed from fluorocarbon gases in the plasma. In aluminum etch processes, the polymers are formed from, among other things, photoresist sputtered into the plasma from the substrate 25. The problem is that flattening the dome shape of the coil or bringing the coil closer to the substrate to increase local ionization at the center of the substrate 25, while enhancing ion density over the substrate center, suppresses the deposition or formation of polymer near the substrate center. Without such polymer formation, etch selectivity is reduced or non-existent. Conversely, enhancing etch selectivity by reducing local ionization at the substrate center (by unflattening the dome-shaped coil) reduces ion density at the substrate center, thereby degrading ion density uniformity.

In the etching process, the substrate 25 is placed on a cathode plasma electrode 57a in the chamber 50, and the walls 63 of the chamber 50 are electrically grounded to form an anode plasma electrode 57b. The substrate 25 can be held during the etching process using a mechanical or electrostatic chuck 73. When the cathode electrode 57a is electrically biased with respect to the anode electrode 57b by applying a RF voltage to the cathode electrode 57, the plasma ions formed in the chamber 50 are attracted toward, energetically impinge upon, and etch the substrate 25. The RF voltage applied to the plasma electrodes 57a, 57b has a second power level of from about 100 to about 500 Watts, and more typically from 100 to 250 Watts. Optionally, a magnetic field (not shown) can be used to enhance the density or uniformity of the plasma. The plasma in the quasi-remote plasma zone 60 is formed (i) inductively by applying an RF current to the inductor coil plasma generator 55 encircling the process chamber 50, (ii) capacitively by applying an RF current to the plasma electrodes 57a, 57b in the process chamber 50, or (iii) both inductively and capacitively.

The power ratio $P_r$ of the first power level of the RF current applied to the inductor coil to the second power level of the RF voltage applied to the plasma electrodes 57a, 57b is selected to increase the number of dissociated ions without increasing the total number, or kinetic bombardment energy, of the plasma ions. An excessively high power ratio $P_r$ can cause excessive sputtering of the substrate 25 resulting in non-uniform etching and high profile microloading. Conversely, an excessively low power ratio $P_r$ can cause insufficient dissociation of the etchant gas into dissociated ions resulting in etchant residue formation on the substrate 25. Thus, preferably, the power ratio $P_r$ is at least about 4:1, more preferably is at least about 7:1, and most preferably is from about 4:1 to about 10:1.

To perform the etching process, the chamber 50 is evacuated to a pressure of about 1 mTorr, and a substrate 25 is transferred to the chamber 50 from a transfer chamber (not shown) maintained at vacuum. Etchant process gas is introduced into the chamber 50 through the gas distributor 65, and the chamber 50 is maintained at a pressure ranging from about 1 to about 1000 mTorr, and more typically from 10 to 300 mTorr. Plasma ions are generated from the process gas by applying an electric field having a field flux $E_f$ to the process gas by passing an RF current through the inductor coil. An RF bias voltage is applied to the cathode electrode 57a below the substrate 25 to cause the inductively generated plasma ions to energetically impinge upon and etch the substrate 25. Spent process gas and etchant byproducts are exhausted from the process chamber 50 through an exhaust system 74 capable of achieving a minimum pressure of about $10^{-3}$ mTorr in the process chamber 50. A throttle valve 76 is provided in the exhaust for controlling the pressure in the chamber 50.

A process gas comprising (i) chlorine-containing etchant gas capable of ionizing in the applied electric field to form dissociated ions and non-dissociated ions, and (ii) an inert gas, is introduced into the process chamber 50. The combination of (i) the volumetric flow ratio $V_r$ of etchant gas to inert gas, and (ii) the power ratio $P_r$ of the currents used to generate, and energize the plasma, are selected to increase dissociation of etchant gas into the dissociated ions, so that the number of dissociated ions is at least about 60%, and more preferably at least about 80%, of the total number of ions in the plasma. Preferably, the volumetric flow ratio $V_r$ of the process gas and the power ratio $P_r$ are selected so that the etchant gas ionizes to form dissociated $Cl^+$ ions and dissociated $Cl_2^+$ ions in a mass ratio of at least about 0.6:1, and more preferably at least about 1:1. It has been discovered that an elevated ratio of dissociated $Cl^+$ ions to non-dissociated $Cl_2^+$ ions, provides good etching rates while removing substantially all the etchant residue on the substrate 25. Excessive chlorine-containing gas causes the first component of the multicomponent alloy 20, for example aluminum, to be etched at higher etch rates compared to the second components, for example silicon and copper, resulting in etchant residue forming on the substrate 25. Excessive inert gas causes excessive sputtering of the resist on the substrate 25, resulting in resist faceting, oxide loss, and high profile microloading. It is believed that at select combinations of volumetric flow ratio $V_r$ and power ratio $P_r$, an increased number of dissociated ions is formed without increasing the total number, or kinetic bombardment energies, of the plasma ions. This plasma chemistry allows etching of the first components of the multicomponent alloy 20 at etch rates that are substantially equivalent to the rate of etching of the second components, thereby etching the multicomponent alloy 20 at high etch rates without forming etchant residue on the substrate 25.

The frequency of the RF current applied to the inductor coil plasma generator 55 can be from about 400 KHz to about 13.56 MHZ. Preferably, a low frequency current is used, the frequency being less than about 6 MHZ, more preferably from about 1 to about 3 MHZ, and most preferably about 2 MHZ, as generally described in aforementioned U.S. patent application Ser. No. 08/307,870. At these low frequencies, capacitive coupling from the plasma power source is reduced, allowing increase of the plasma source power level to greater than about 750 Watts, and more preferably from 1000 to 1600 Watts. This provides a high density inductively coupled plasma without appreciably increasing the kinetic bombardment energy of the plasma ions. Also, under these conditions the concentration of the etchant gas can be increased to about 80% to provide high etch rates, good etching uniformity, reduced profile microloading, and reduced etchant residue on the substrate 25. In accordance with this aspect of the invention, a low RF frequency current at an elevated power level is applied to the inductor coil plasma generator 55 to increase the plasma source power by a factor at least of 1.5, without increasing the kinetic energy of the plasma ions. More preferably, an RF voltage having a frequency greater than 6 MHZ, and more typically about 13.56 MHZ, is applied to the plasma electrodes 57a, 57b, so that the inductor coil and the plasma electrodes operate at very different frequencies, thereby avoiding RF interference and RF matching instabilities.

Preferably, the volumetric flow ratio $V_r$ of etchant gas to inert gas and power ratio $P_r$ are selected so that the sidewalls of the etched features 30 have smooth surfaces and form angles (α) of at least about 85° with the substrate 25, and the ratio of the rate of etching of the multicomponent alloy 20 to the rate of etching of the resist 45 is greater than about 2.5, and more preferably greater than 3. Also, when a barrier layer 35 is deposited below the multicomponent layers 20, the volumetric flow ratio $V_r$ and the power ratio $P_r$ are selected so that the etch rate of the multicomponent alloy layer 20 is at least about five times the etch rate of the barrier layer 35. The slow etch rate of the barrier layer 35 allows stopping the etch process on the barrier layer 35 without etching through the barrier layer 35. Thus, when the etch rate of the multicomponent layer 20 is about 500 nm/min, the etch rate of the barrier layer 35 should be less than about 100 nm/minute.

The choice of a suitable chlorine-containing etchant gas depends on the composition of the multicomponent alloy layers 20 that are etched. For multicomponent aluminum alloys 20, suitable chlorine-containing etchant gases include $Cl_2$, HCl, $BCl_3$, HBr, $CCl_4$, $SiCl_4$, and mixtures thereof. The etchant gas ionizes in the applied electric field to form dissociated $Cl^+$ ions and non-dissociated $Cl_2^+$ ions that react with the aluminum to form volatile aluminum chloride that is exhausted from the chamber 50. Although the invention is illustrated using chlorine-containing etchant gas used for etching aluminum-containing layers, it should be understood that the etchant gas can be any etchant gas that is capable of dissociating to form dissociated ions that chemically react with the multicomponent alloy layer 20 to form volatile species that can be exhausted from the process chamber 50. For example, the etchant gas can comprise other halogen-containing gases such as F, $NF_3$, HF, $CHF_3$, $COH_2F_2$, $CH_3F$, $CF_2Cl_2$, $SF_6$, $CFCl_3$, $CF_4$, or $SiCl_4$. Thus, the present invention should not be limited to the chlorine-containing etchant gas used to illustrate the invention. Preferably, the etchant gas is also suitable for (i) etching the surface or "native" oxide film on the surface of the substrate 25, and (ii) forming a passivating layer on sidewalls of etched features 30 on the substrate 25 to prevent isotropic etching of the features 30. A gas passivator such as $N_2$, HCl, $CHF_3$, $CF_4$, $CH_4$, and mixtures thereof, can also be added to the process gas to control etch rates.

Suitable inert gases include argon, xenon, krypton and neon. Preferably, the inert gas ionizes in an applied electric field to form numerous ionized metastable states that serve to enhance dissociation of the primary etchant. It is also desirable for the inert gas to have a wide range of excitation energies, so that energy transfer reactions which promote dissociation of the etchant gas can occur between the excited inert gas and the primary etchant gas.

Preferably, the process gas comprises chlorine and argon in a volumetric flow ratio $V_r$ of from about 4:1 to about 1:4, and more preferably from 1.5:1 to 1:1. This process gas composition provides high etch rates, little or no residue remaining on the substrate 25, and etch selectivity ratios greater than 3. More preferably, the etchant gas comprises $Cl_2$ and $BCl_3$ in a volumetric ratio ranging from 10:1 to 1:1. This process gas composition provides high etch rates of 500 to 1000 nm/min, substantially perpendicular features 30 having sidewalls with angles of 85° to 90°, and an etching selectivity ratio greater than 2.5. For the process chamber 50 described herein, a suitable flow rate of chlorine is from about 40 sccm to about 250 sccm, and preferably from 70 to 185 sccm; a suitable flow rate of argon is from about 10 to about 150 sccm, and preferably from 50 to 100 sccm; and a suitable flow rate of $BCl_3$ is from about 10 to about 150 sccm, and preferably from 10 to 60 sccm. It should be understood that the actual flow rates of the process gases are dependent upon the volume of the chamber 50, and thus the invention should not be limited in scope to the flow rates recited herein.

EXAMPLES

The following examples illustrate use of the apparatus and method of the present invention for processing of semiconductor substrates 25. However, the apparatus and method can be used in other applications as would be apparent to those skilled in the art. Thus, the scope of the present invention should not be limited by the illustrative examples provided herein.

Example 1

Example 1 demonstrates that increasing the argon to chlorine flow ratio at a constant power ratio $P_r$ of about 8.3, increases the number of dissociated chlorine ions ($Cl^+$) in relation to the number of non-dissociated or molecular chlorine ions ($Cl_2^+$) without increasing the total number of ions in the plasma. In this example, a multicomponent alloy layer 20 comprising aluminum, silicon, and copper was etched using chlorine and argon at various process gas flow ratios. The flow of chlorine was maintained at 100 sccm for these experiments, except that the flow of chlorine was maintained at 75 sccm when the volumetric flow ratio $V_r$ was about 1. The process chamber 50 was maintained at a pressure of 10 mTorr. An RF current having a power level of about 1000 Watts was applied to the inductor coil plasma generator 55, and an RF current having a power level of about 120 Watts was applied to the plasma electrodes 57a, 57b.

Figure 3:
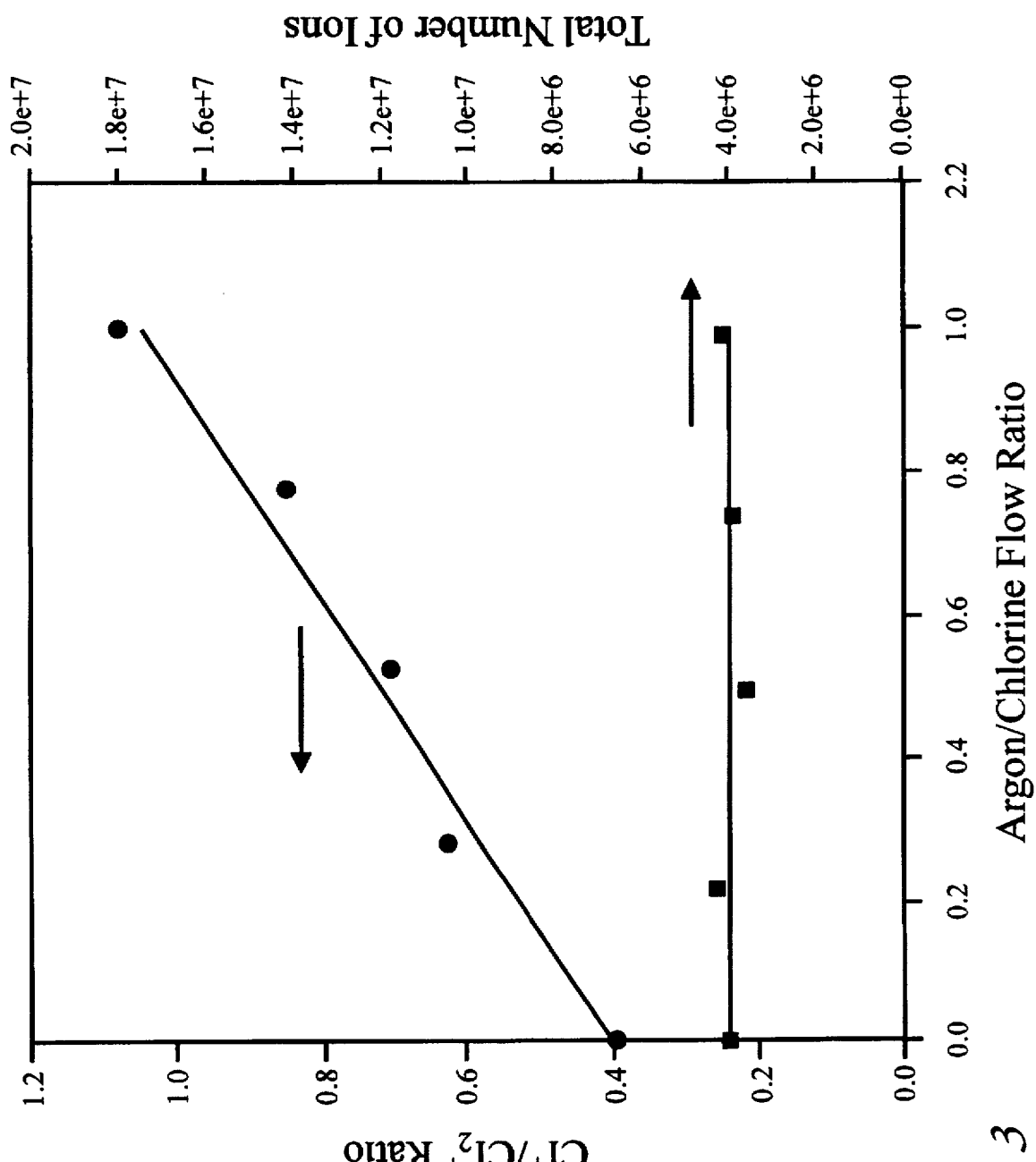
FIG. 3 is a graph showing the (i) ratio of the number of dissociated chlorine ions to non-dissociated chlorine ions, and (ii) total number of ions, in the plasma for increasing volumetric flow ratios of argon to chlorine.

FIG. 3 is a graph showing the change in (i) the ratio of dissociated $Cl^+$ ions to non-dissociated $Cl_2^+$ ions in the plasma, and (ii) the total number of ions in the plasma, as a function of increasing volumetric flow ratios of argon to chlorine. By ion it is meant an atom or molecule which by loss or gain of an electron has acquired a net electric charge. It is seen that increasing the argon to chlorine volumetric flow ratio at a power ratio $P_r$ of about 8.3, increases the number of dissociated chlorine ions ($Cl^+$) in relation to the number of non-dissociated chlorine ions ($Cl_2^+$) without increasing the total number of ions in the chamber 50. As the flow ratio of argon to chlorine is increased from 0 to 1, the amount of dissociated $Cl^+$ ions to non-dissociated $Cl_2^+$ ions increases from 0.4 to 1, and the total number of ions remain substantially constant at $4 \times 10^{+6}$ c/s.

The number of dissociated $Cl^+$ ions and the number of non-dissociated $Cl_2^+$ ions were measured using a EQP Mass Spectrometer, commercially available from Hiden Analytical, Warrington, England; as described in "The EQP Mass Spectrometer for Plasma Diagnosis and Research," Hiden Analytical (1995), which is incorporated herein by reference. The EQP Mass Spectrometer combines an electrostatic sector energy analyzer with a quadruple mass filter. A pulse counting electron multiplier that can be configured for positive or negative ion operation is used for ion detection. The spectrometer provides a high dynamic range, typically $10^6$, for plasma ions and neutrals.

Examples 2 and 3

Examples 2 and 3 demonstrate that for select volumetric flow ratios $V_r$, power ratios $P_r$, the average plasma ion current flux increases, the plasma dc voltage remains constant, and the average energy of the plasma ions actually shifts to lower values.

In both examples, a multicomponent alloy 20 comprising aluminum, silicon and copper, on a substrate 25 was etched. The chamber 50 was maintained at a pressure of 10 mTorr. An RF current having a power of about 1000 Watts was applied to the inductor coil plasma generator 55, and a RF current of 120 Watts was applied to the plasma electrodes 57a, 57b.

Figure 4:
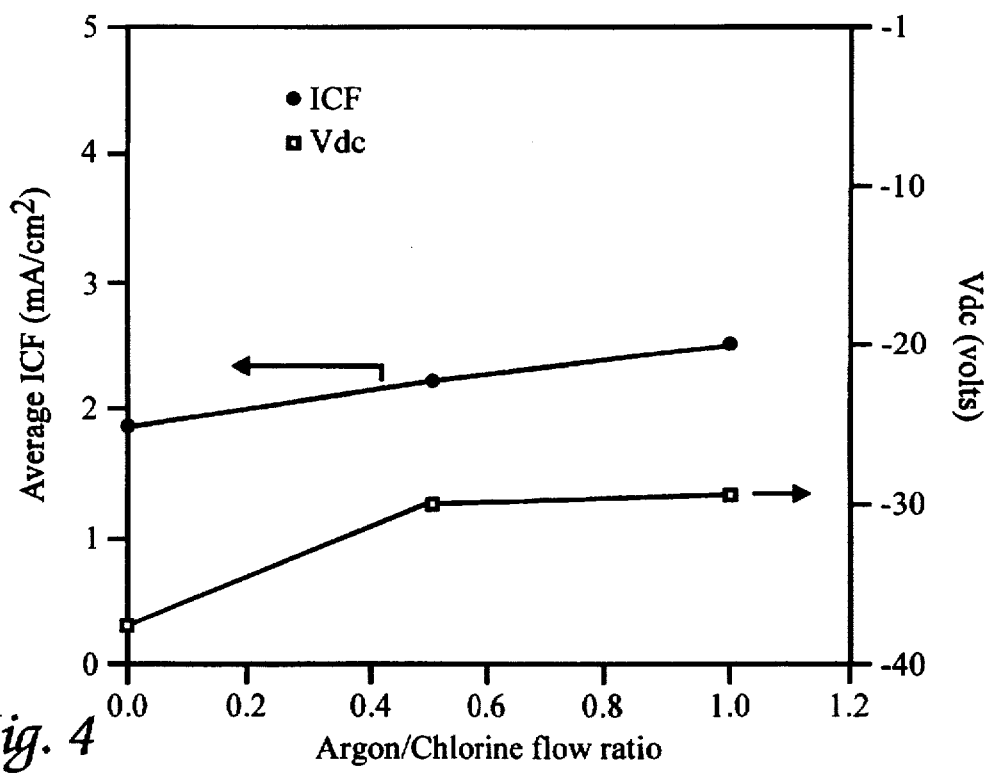
FIG. 4 is a graph showing the change in (i) average ion current flux in the plasma, and (ii) voltage of the plasma, for increasing volumetric flow ratio of argon to chlorine.

In Example 2, a process gas comprising 100 sccm chlorine, 45 sccm $BCl_3$, and 13 sccm argon was used, and the chamber 50 was maintained at a pressure of 10 mTorr. An RF current having a power of about 1000 Watts was applied to the inductor coil 64, and a RF current of 100 Watts was applied to the plasma electrodes 70, 72. FIG. 4 shows that increasing volumetric flow ratios of argon to chlorine increased the average ion current flux of the plasma from about 1.8 to 2.3 m Å/cm².

Figure 5:
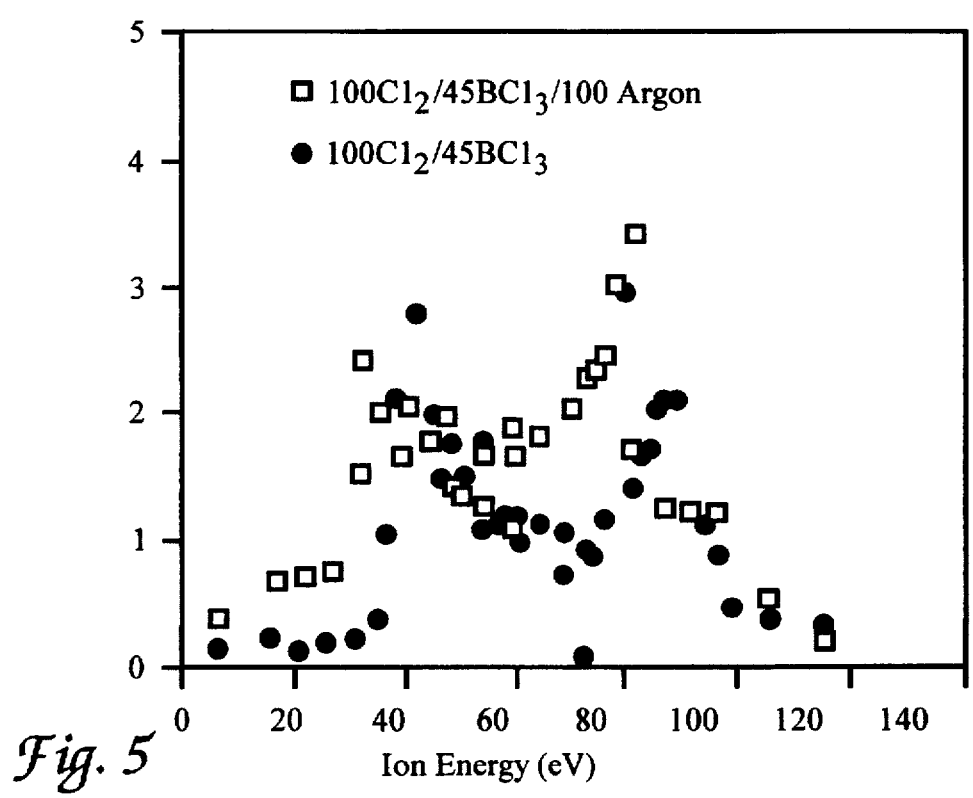
FIG. 5 is a graph showing the change in distribution of ion energies of the plasma for increasing volumetric flow ratio of argon to chlorine.

In Example 3, two different process gas compositions were used. The first gas composition (corresponding to the solid black circles in FIG. 5) comprised 100 sccm chlorine and 45 sccm $BCl_3$ with no argon gas. The second gas composition (corresponding to the hollow rectangles in FIG. 5) comprised 100 sccm chlorine, 45 sccm $BCl_3$ and 13 sccm argon gas. FIG. 5 shows the change in plasma ion energy distribution for the two different process gas compositions demonstrating that select volumetric flow ratios $V_r$ and electric field fluxes $E_f$ result in an etchant plasma having an ion energy distribution that shifts to lower median values of ion energy.

Examples 4–6

Figure 6:
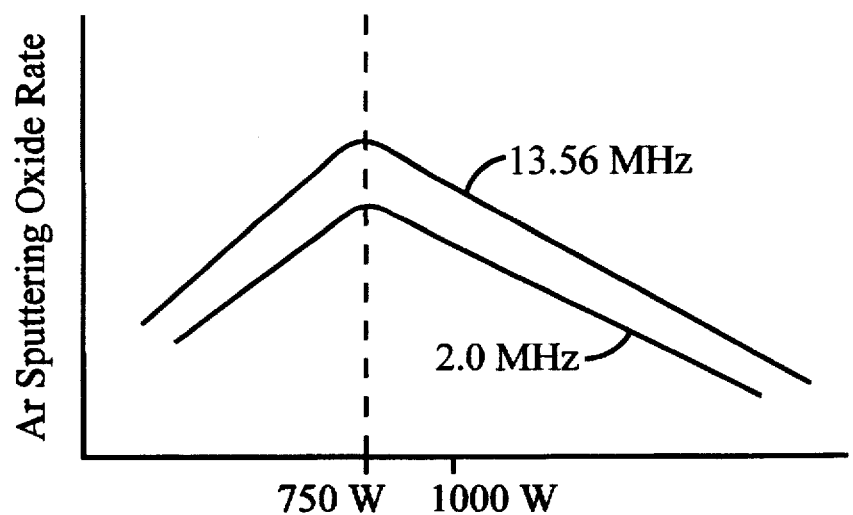
FIG. 6 is a graph showing the change in argon sputtering rate for different frequencies of RF current applied to the inductor coil plasma generator.
Figure 7:
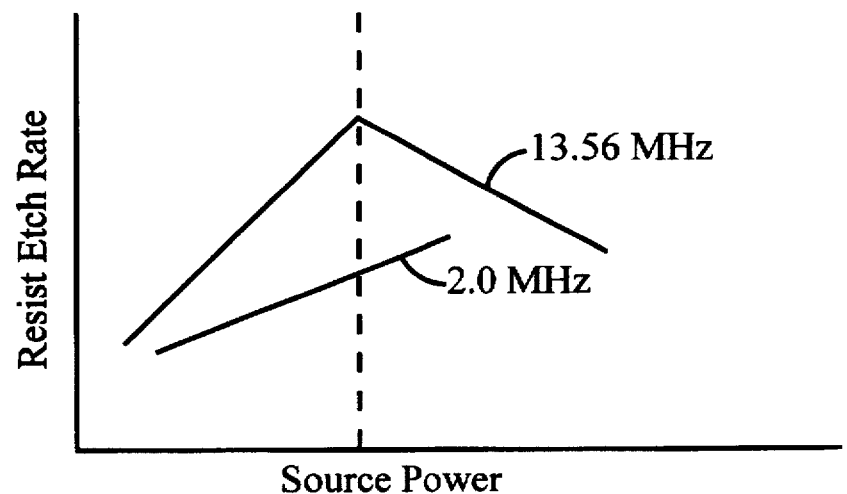
FIG. 7 is a graph showing the change in resist etch rate for different frequencies of RF current applied to the inductor coil plasma generator.

The importance of the frequency of the RF currents applied to the inductor coil plasma generator 55 is demonstrated in FIGS. 6 and 7. FIG. 6 is a graph showing the change in argon sputtering rate for different frequencies of the RF current applied to the inductor coil. FIG. 6 shows that the argon sputtering rate of a silicon oxide layer on a substrate 25 is lower in two ways, (i) first, the sputtering rate is lower at 2 MHZ than at 13.56 MHZ at all levels of plasma source power, (ii) second, the sputtering rate at 2 MHZ decreases as the plasma source power level increases above about 750 Watts.

FIG. 7 is a graph showing the change in resist etch rate for different frequencies of the RF current applied to the inductor coil plasma generator 55. While the prior art would expect a deleterious increase in resist etching rate with increases in the plasma power level to over 1000 Watts, no such resist etch rate is observed at the low RF frequency of 2 MHZ because of the reduced capacitive coupling of the plasma at this frequency. In FIG. 7, it is seen that the resist etch rate at 2 MHZ is less than the resist etch rate at 13.56 MHZ over a wide range of plasma source power levels.

Although the present invention has been described in considerable detail with regard to the preferred versions thereof, other versions are possible. For example, gases equivalent in function to the chlorine-containing etchant gas or the inert gas can also be used. Therefore, the appended claims should not be limited to the descriptions of the preferred versions contained herein.

What is claimed is:

1. A method of etching a multicomponent alloy on a substrate, substantially without forming etchant residue on the substrate, the method comprising the steps of:

(a) placing the substrate in a process chamber comprising a plasma generator and plasma electrodes;

(b) introducing into the process chamber, process gas comprising a volumetric flow ratio $V_r$ of (i) a chlorine-containing gas capable of ionizing to form dissociated $Cl^+$ plasma ions and non-dissociated $Cl_2^+$ plasma ions, and (ii) an inert gas capable of enhancing dissociation of the chlorine-containing gas; and (c) ionizing the process gas to form plasma ions that energetically impinge on the substrate by (i) applying RF current at a first power level to the plasma generator, and (ii) applying RF current at a second power level to the plasma electrodes, wherein (i) a power ratio $P_r$ of the first power level to the second power level, and (ii) the volumetric flow ratio $V_r$ are selected so that the chlorine-containing etchant gas ionizes to form dissociated $Cl^+$ plasma ions and non-dissociated $Cl_2^+$ plasma ions in a number ratio of at least about 0.6:1, thereby etching the multicomponent alloy on the substrate at an etch rate of at least about 500 nm/min, substantially without forming etchant residue on the substrate.

2. The method of claim 1, wherein the multicomponent alloy on the substrate comprises first and second components, the first components being substantially more reactive to the plasma ions than the second components, and wherein the volumetric flow ratio $V_r$ and the power ratio $P_r$ are selected so that the first components are etched at an etch rate that is substantially equivalent to a rate of etching of the second components.

3. The method of claim 1, wherein the multicomponent alloy is etched to form features that have sidewalls, and wherein the volumetric flow ratio $V_r$ and the power ratio $P_r$ are selected so that the sidewalls of the features form angles of at least about 85° with the substrate.

4. The method of claim 1, wherein the multicomponent alloy comprises a resist thereon, and wherein the volumetric flow ratio $V_r$ and the power ratio $P_r$ are selected so that the ratio of the rate of etching of the multicomponent alloy to the rate of etching of the resist is at least about 2.5.

5. The method of claim 1, wherein the chlorine-containing gas ionizes to form dissociated $Cl^+$ ions and non-dissociated $Cl_2^+$ ions in a number ratio of at least about 1:1.

6. The method of claim 1, wherein the substrate comprises a barrier layer below the multicomponent alloy, and the volumetric flow ratio $V_r$ and the power ratio $P_r$ are selected so that the etch rate of the barrier layer is less than about 100 nm/minute.

7. The method of claim 1, wherein the volumetric flow ratio $V_r$ of chlorine-containing gas to inert gas is from about 4:1 to about 1:4.

8. The method of claim 1, wherein the power ratio $P_r$ of the first power level to the second power level is at least about 4:1.

9. The method of claim 8, wherein the power ratio $P_r$ of the first power level to the second power level is at least about 7:1.

10. The method of claim 1, wherein the first power level is at least about 750 Watts.

11. The method of claim 1, wherein the second power level is less than about 500 Watts.

12. The method of claim 1, wherein the frequency of the RF current applied to the inductor coil is less than about 6 MHZ.

13. The method of claim 1, wherein the frequency of the RF current applied to the plasma electrodes is greater than about 6 MHZ.

14. The method of claim 1, wherein the chlorine-containing gas is selected from the group consisting of $Cl_2$, HCl, $BCl_3$, HBr, $CCl_4$, $SiCl_4$, and mixtures thereof.

15. The method of claim 1, wherein the inert gas is selected from the group consisting of argon, xenon, krypton, and neon.

16. The method of claim 1, wherein the process gas consists essentially of $Cl_2$, $BCl_3$ and argon.

17. A method of plasma etching a multicomponent alloy on a substrate substantially without forming etchant residue, the method comprising the steps of:
   (a) placing a substrate in a quasi-remote plasma zone of a process chamber comprising (i) a ceiling with an apex at a height H above the substrate, the height H being from about 100 mm to about 175 mm, for a substrate having a diameter D of from about 150 mm to about 304 mm, and (ii) a plasma generator capable of forming a plasma below the ceiling and above the substrate;
   (b) introducing into the process chamber, process gas comprising a volumetric flow ratio $V_r$ of (i) chlorine-containing gas capable of ionizing to form dissociated $Cl^+$ ions and non-dissociated $Cl_2^+$ ions, and (ii) inert gas capable of enhancing dissociation of the chlorine-containing gas; and
   (c) ionizing the process gas in the quasi-remote plasma zone so that the chlorine-containing gas ionizes substantially directly above the substrate to form dissociated $Cl^+$ ions and non-dissociated $Cl_2^+$ ions in a number ratio of at least about 0.6:1, thereby etching the multicomponent alloy on the substrate substantially without forming etchant residue.

18. The method of claim 17, wherein in step (a), the quasi-remote plasma zone of the process chamber is surrounded by sidewalls adjacent to the substrate, and comprises a volume of at least about 10,000 $cm^3$.

19. The method of claim 18, wherein in step (a), the quasi-remote plasma zone of the process chamber has a center located at a distance of about 50 to about 150 mm from the substrate.

20. The method of claim 18, wherein in step (a), the ceiling of the quasi-remote plasma zone of the process chamber has at least one of the following shapes:
   (a) flat;
   (b) conical;
   (c) arcuate; and
   (d) multi-radius dome.

21. The method of claim 17, wherein the chlorine-containing gas ionizes in the quasi-remote plasma zone to form dissociated $Cl^+$ ions and non-dissociated $Cl_2^+$ ions in a number ratio of at least about 1:1.

22. The method of claim 17, wherein the volumetric flow ratio $V_r$ of chlorine-containing gas to inert gas is from about 1:1 to about 10:1.

23. The method of claim 17, wherein the process gas is ionized in the quasi-remote plasma zone by applying an RF current having a first power level of at least about 750 Watts to a plasma generator comprising an inductor coil adjacent to the quasi-remote plasma zone.

24. The method of claim 23, wherein the dissociated $Cl^+$ ions and non-dissociated $Cl_2^+$ ions in the quasi-remote plasma zone are attracted to the substrate by applying an RF current having a second power level of less than about 500 Watts to plasma electrodes in the quasi-remote plasma zone.

25. The method of claim 24, wherein the power ratio $P_r$ of the first power level to the second power level is at least about 4:1.

26. The method of claim 25, wherein the power ratio $P_r$ of the first power level to the second power level is at least about 7:1.

27. The method of claim 23, wherein the frequency of the RF current applied to the inductor coil is less than about 6 MHZ.

28. The method of claim 24, wherein the frequency of the RF current applied to the plasma electrode is greater than about 6 MHZ.

29. The method of claim 17, wherein the chlorine-containing gas is selected from the group consisting of $Cl_2$, HCl, $BCl_3$, HBr, $CCl_4$, $SiCl_4$, and mixtures thereof.

30. The method of claim 17, wherein the inert gas is selected from the group consisting of argon, xenon, krypton, neon, and mixtures thereof.

31. A method for etching a substrate comprising a multicomponent alloy substantially without forming etchant residue, the method comprising the steps of:
   (a) placing the substrate in a process chamber;
   (b) introducing into the process chamber, a process gas comprising (i) etchant gas capable of dissociating in an electric field to form dissociated ions and non-dissociated ions, and (ii) inert gas capable of enhancing dissociation of the etchant gas; and
   (c) applying an electric field to the process gas to form a plasma by maintaining an RF current in an inductor coil surrounding the process chamber, the RF current having a power level of at least about 750 Watts and an RF frequency of less than about 6 MHZ, to obtain a sufficiently elevated ratio of dissociated ions to non-dissociated ions to etch the multicomponent alloy on the substrate at an elevated etch rate substantially without forming etchant residue on the substrate.

32. The method of claim 31, wherein the volumetric flow ratio $V_r$ of etchant gas to inert gas is from about 1:1 to about 10:1.

33. The method of claim 31, wherein the electric field is generated by applying an RF current at a frequency from about 1 to 3 MHZ to the inductor coil.

34. The method of claim 31, wherein the power of the RF current applied to the inductor coil is at least about 1000 Watts.

35. The method of claim 31, wherein the process chamber comprises plasma electrodes for attracting the plasma to the substrate, and wherein the process further comprises the step of applying an RF voltage at a frequency of greater than 6 MHZ to the plasma electrodes.

* * * * *